(12) United States Patent
Herberholz et al.

(10) Patent No.: US 8,710,616 B2
(45) Date of Patent: Apr. 29, 2014

(54) DIE SEAL RING

(75) Inventors: Rainer Herberholz, Cambridge (GB); Howard Godfrey, Cambridge (GB)

(73) Assignee: Cambridge Silicon Radio Ltd., Cambridge (GB)

( * ) Notice: Subject to any disclaimer, the term of this patent is extended or adjusted under 35 U.S.C. 154(b) by 287 days.

(21) Appl. No.: 13/133,791

(22) PCT Filed: Nov. 10, 2009

(86) PCT No.: PCT/GB2009/051504
§ 371 (c)(1),
(2), (4) Date: Jun. 9, 2011

(87) PCT Pub. No.: WO2010/070304
PCT Pub. Date: Jun. 24, 2010

(65) Prior Publication Data
US 2011/0241182 A1    Oct. 6, 2011

(30) Foreign Application Priority Data

Dec. 15, 2008  (GB) .................................. 0822722.5

(51) Int. Cl.
*H01L 29/02*  (2006.01)
(52) U.S. Cl.
USPC ..... 257/489; 257/488; 257/536; 257/E29.112
(58) Field of Classification Search
USPC ......... 257/488, 489, 499, 503, 528, 536, 659, 257/773, 786, E29.111, E29.112, E23.002; 438/218, 223, 294, 298, 353, 400, 454
See application file for complete search history.

(56) References Cited

U.S. PATENT DOCUMENTS

| | | | |
|---|---|---|---|
| 6,492,716 B1 | 12/2002 | Bothra et al. | |
| 8,106,514 B2 * | 1/2012 | Nakashiba | 257/758 |
| 2004/0150070 A1 * | 8/2004 | Okada et al. | 257/508 |
| 2005/0110119 A1 * | 5/2005 | Chen | 257/620 |
| 2008/0251923 A1 | 10/2008 | Wang et al. | |

FOREIGN PATENT DOCUMENTS

EP    1443557 A2    8/2004

OTHER PUBLICATIONS

WIPO, International Preliminary Report on Patentability of PCT Appln. No. GB2009/051504, Jun. 21, 2011, 8 pages.

* cited by examiner

*Primary Examiner* — Eduardo A Rodela
(74) *Attorney, Agent, or Firm* — Frommer Lawrence & Haug LLP; John W. Branch

(57) ABSTRACT

An improved die seal ring is described which includes at least one break. In the region of the break in the die seal ring, the doping is modified so that the impedance of the electrical path across the break through the substrate is increased. Offsets in the break may also be used and the offset may be within a break in a track and/or between breaks in different tracks, where the die seal ring includes more than one track.

12 Claims, 8 Drawing Sheets

701  702

DIE SEAL RING

BACKGROUND

Die seal ring structures (also referred to as 'chip seal rings' or 'seal rings') are commonly used around the periphery of integrated circuits (ICs) in order to protect the circuit components from mechanical damage both during assembly and in operation. The main risk of mechanical damage in assembly arises from cracks in the dielectric layers which may occur when a processed wafer is diced into individual die (e.g. using a wafer saw). These cracks in the dielectric layers may then propagate further into the die if it is thermally cycled (e.g. during assembly or during operation). Other damage, such as chipping, may also occur when the wafer is diced. In operation, the die seal ring protects the chip edge from the diffusion of moisture and mobile ions (also referred to as 'ionic contamination') into the die. If moisture ingress is not stopped, the moisture can result in an increase in the dielectric constant of oxides and reduce the reliability of the die through various mechanisms. The ingress of mobile ions, if allowed, can also affect the reliability and performance of the IC.

FIG. 1a shows a schematic diagram of a die 100 which includes a die seal ring 101 which surrounds the circuitry 102 of the IC. The die seal ring structure 101 comprises a continuous barrier of metals formed by all the conductive layers within the die, including contacts, metals and vias. FIG. 1a also shows a region 103 inside the die seal ring, which may be referred to as a 'keep-out zone', which is not occupied by any circuitry, such that the die seal ring 101 and the circuitry are always separated by a certain distance (i.e. the width of the keep-out zone).

The die seal ring is usually tied to the substrate of the die (or to the ground of the IC via the substrate) to prevent the build up of electrical charge and to prevent it from forming an inductor around the IC.

The continuous seal ring structure 101 shown in FIG. 1a, however, can be detrimental to the performance of the IC as the seal ring spreads unwanted signals across the die. Such signals may be picked up from the substrate or by inductive coupling, for example, where the seal ring runs close to a noisy or high power circuit and can cause interference in voltage references, voltage-controlled oscillators, low noise amplifiers and other sensitive analogue circuits. Examples of interferers include digital switching noise, power amplifiers and switched DC/DC converters.

Although the schematic diagram of die 100 in FIG. 1a shows a single die seal ring 101, in some examples, the die seal ring structure may comprise independent inner and outer rings or tracks. In such a configuration, the outer track may predominantly be intended to prevent the propagation of cracks which may formed during dicing of the wafer into individual die, whilst the inner track (which is usually wider than the outer track) provides a hermetic seal against ingress of moisture and mobile ions.

A solution that has been proposed in order to reduce the spread of noise by the die seal ring around the perimeter of the die involves the introduction of breaks 112 and 124 into the die seal ring 101 and 121, as shown in the schematic diagram in FIGS. 1b and 1c. In a first example, as shown in FIG. 1b, the die seal ring 101 around the periphery of the die 110 includes a break 112. In a second example, as shown in FIG. 1c, which shows an enlarged portion of a die seal ring 121, the die seal ring comprises an outer track 122 and an inner track 123 and a break 124 is introduced into both tracks. Other solutions involve designing the circuits on the IC to tolerate the noise coupled by the seal ring or increasing the width of the keep-out zone to reduce coupling between the die seal ring and the circuitry. Increasing the width of the keep-out zone is, however, undesirable as it either results in a larger die or reduces the available area for circuitry.

The embodiments described below are not limited to implementations which solve any or all of the disadvantages of known die seal rings and die seal ring designs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An improved die seal ring is described which includes at least one break. In the region of the break in the die seal ring, the doping is modified so that the impedance of the electrical path across the break through the substrate is increased. Offsets in the break may also be used and the offset may be within a break in a track and/or between breaks in different tracks, where the die seal ring includes more than one track.

A first aspect provides an integrated circuit die comprising: electronic circuitry formed on a substrate; and a seal ring around a periphery of the die, the seal ring comprising at least one break and wherein doping in a region around the break is modified to increase electrical impedance of a path through the substrate across the break.

By increasing the impedance through the substrate in the region of the break, the unwanted distribution of signals around the periphery of the die is reduced.

The doping (e.g. the distribution of dopants) in said region may be modified by blocking doping (e.g. implantation of dopants) of a same conduction type as the substrate.

The doping in said region may be further modified by introduction of a well of an opposite conduction type to the substrate in the break.

Silicidation in said region may be blocked in at least a portion away from a metal contact to the substrate.

The doping in said region may be further modified by introduction of a surface doped area of an opposite conduction type to the substrate.

The seal ring may comprise at least one track and the break may comprise an offset break within a track. This reduces the risk of mechanical seal ring failure and increases the distance moisture or mobile ions would have to diffuse to damage the IC.

The offset break may be formed using 45° bends. This reduces stresses in the structure and improves reliability.

The seal ring may comprise at least two tracks and the break may comprise an offset break between tracks. This reduces the risk of mechanical seal ring failure.

The seal ring may comprise a first and a second track and the at least one break may comprise an offset break within each track and the offset break in the first track may be offset from the offset break in the second track. This further reduces the risk of mechanical seal ring failure.

The width of the second track may be increased in a region around the offset break within the second track and the width of the first track may be decreased within the same region (i.e. around the offset break within the second track). This provides an electrically effective and compact break in a die seal ring and does not result in an increase in the area of the die which is required for the die seal ring.

The offset break may be formed in each metal layer and each continuous conductive layer in the seal ring.

A second aspect provides an integrated circuit wafer comprising a plurality of die as described above.

A third aspect provides an integrated circuit comprising a seal ring, said seal ring comprising a break cell substantially as described with reference to any of FIGS. 2, 3b-3d, 5a-5d, 6a-6d, 7a-7b and 8a-8d of the drawings.

A fourth aspect provides a method of fabricating an integrated circuit die comprising: forming electronic circuitry on a substrate; and forming a seal ring around a periphery of the die, the seal ring comprising at least one break and wherein forming a seal ring comprises modifying the doping in a region around the break to increase electrical impedance of a path through the substrate across the break.

Modifying the doping in said region may comprise: blocking dopants of a same conduction type as the substrate.

Modifying the doping in said region may further comprise: introducing a well of an opposite conduction type to the substrate in the break.

Forming a seal ring may further comprise: blocking silicidation in said region in at least a portion away from a metal contact to the substrate.

Modifying the doping in said region may further comprise: introducing a surface doped area of an opposite conduction type to the substrate.

A fifth aspect provides an integrated circuit die comprising: electronic circuitry formed on a substrate; and a seal ring around a periphery of the die, the seal ring comprising a first and a second track and at least one break pair, wherein said break pair comprises an offset break within each track, wherein the offset break in the first track is offset from the offset break in the second track, and a width of the second track is increased in a region around the offset break within the second track and a width of the first track is decreased within the region around the offset break within the second track.

The integrated circuit die may further comprise a region around the break pair in which the doping is modified to increase electrical impedance of a path through the substrate across the break.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1A:
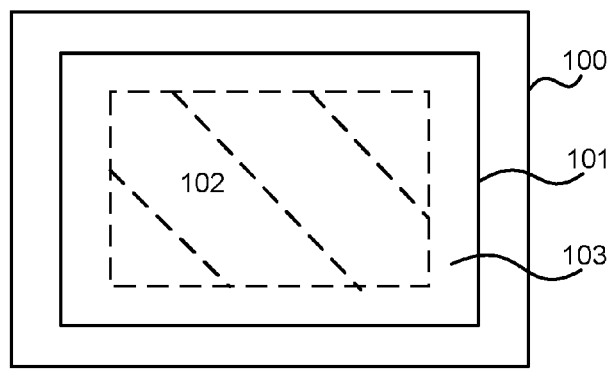
FIGS. 1a-1c show schematic diagrams of die which include a die seal ring.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 1B:
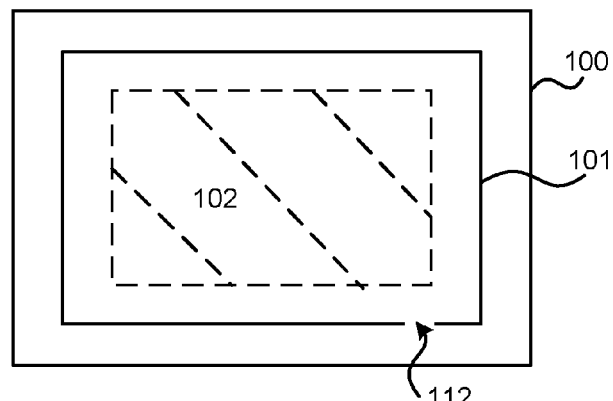
Figure 1C:
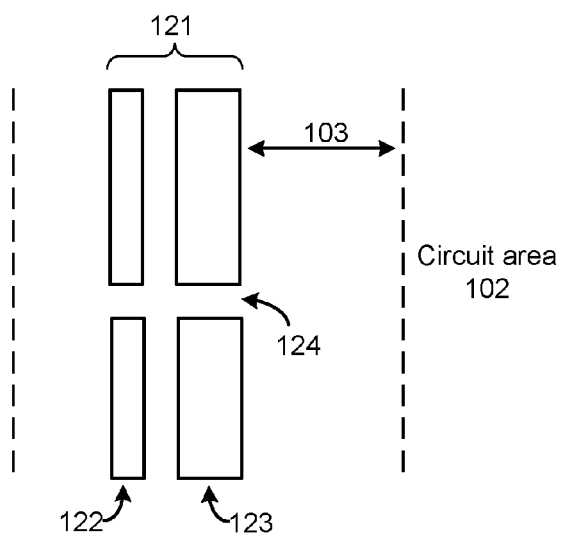

As described above, in order to reduce coupling of noise through the die seal ring around the perimeter of the die, breaks may be introduced into the die seal ring structure, as shown in FIGS. 1b and 1c. The area where these breaks occur may be referred to as 'break cells'. Although the term 'cell' may refer to a structure which may be a library feature which is used in the layout process for the IC, any reference to a break cell herein refers only to a region of the die seal ring structure where a break occurs and does not imply that any particular technique or process is used in laying out the design for the IC.

Figure 2:
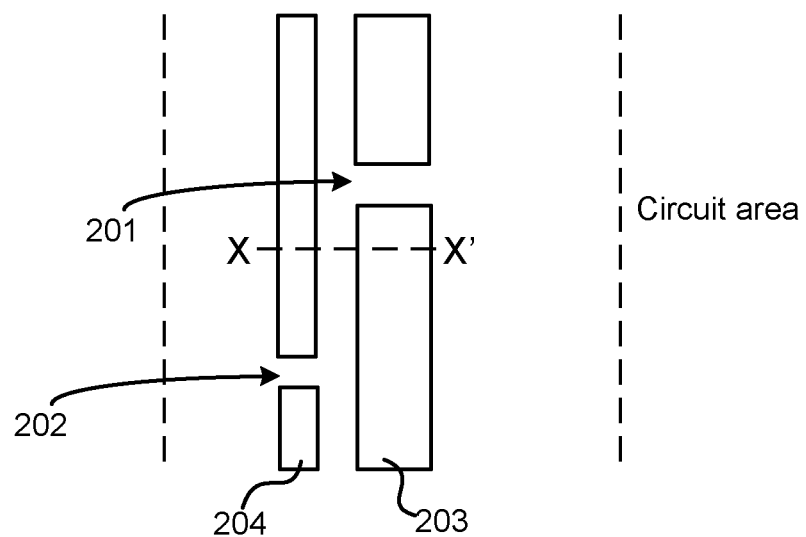
FIG. 2 is a schematic diagram of an offset break design for a die seal ring.

Although breaking the seal ring (e.g. as shown in FIGS. 1b and 1c) does reduce the coupling of noise around the perimeter of the die, the break also reduces the robustness and reliability of the die. This is because in the region of the break there is no structure to prevent crack propagation or ingress of moisture/ions. FIG. 2 shows a break design in which the positions of the inner and outer breaks 201, 202 (in the inner and outer tracks 203, 204 respectively) are offset. By offsetting the breaks, the robustness and reliability of the die is improved (compared to non-offset designs).

In order to increase the electrical impedance of a break cell and reduce the coupling of signals around the die, the implantation (or doping) of the silicon in the region of the break may be modified in order to increase the impedance of the electrical path through the substrate. There are many different ways in which this modification of the distribution of dopants may be achieved and a number of examples can be described with reference to FIGS. 3a-3d. These modifications and the resulting improved break cell can be inserted into a conventional die seal ring to improve its electrical performance.

FIGS. 3a-3d show four cross-sections from the first metal layer (Met-1) down to the substrate 305 in a die seal ring structure. These cross-sections may, for example, be taken through the example break cell shown in FIG. 2 in the position X-X' as shown by a dotted line. Although FIG. 2 and FIGS. 3a-3d show examples where the inner track 203 is wider than the outer track 204, in other examples, the two tracks may be of similar width or the outer track may be wider than the inner track. It will also be appreciated that the die seal ring structure may comprise many metal layers above the first metal layer (Met-1) which are not shown in the figures for purposes of clarity only.

Figure 3A:
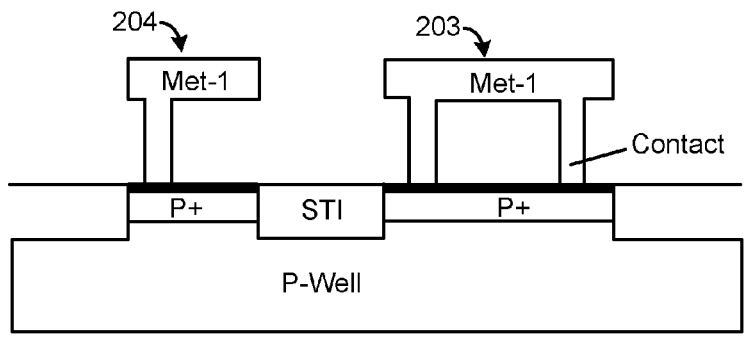
FIGS. 3a-3d show various doping arrangements in the region of a break in a die seal ring.
Figure 3B:
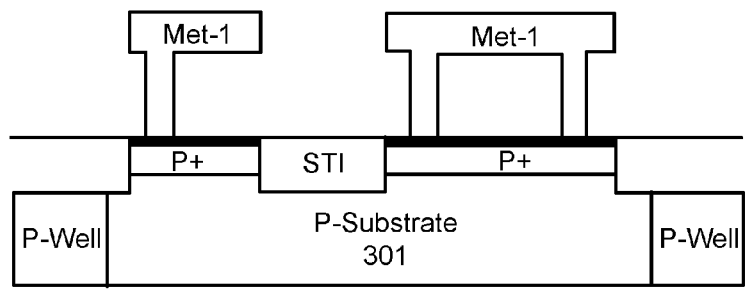
Figure 3C:
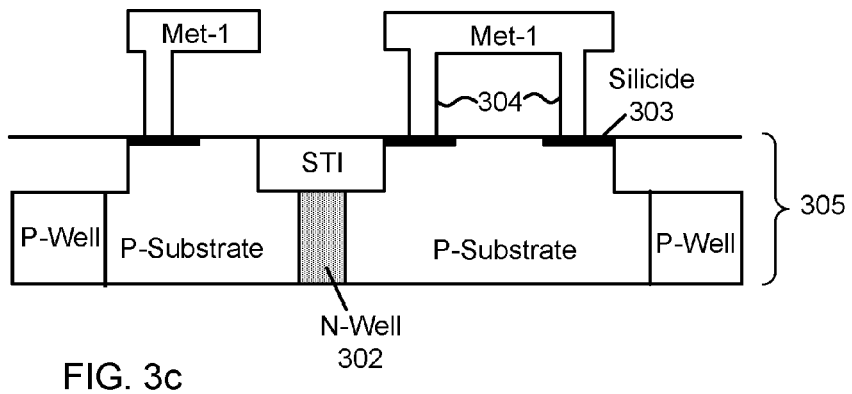
Figure 3D:
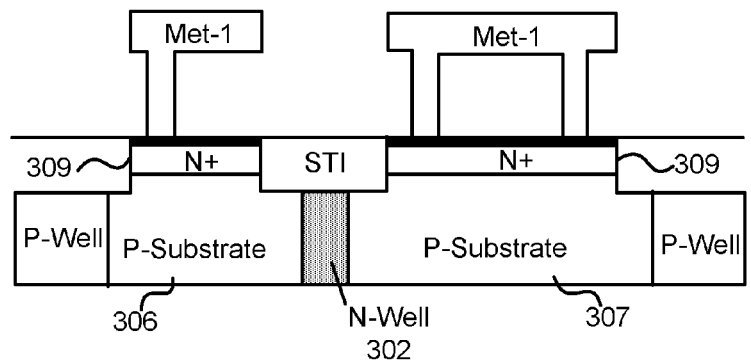

FIG. 3a shows a cross-section through a conventional die seal ring. FIGS. 3b-3d show cross-sections through three examples of an improved die seal ring. All these die seal ring designs (shown in FIGS. 3a-3d) are compatible with copper or low-k interconnect, but may also be used with other interconnects. Low-k interconnects are typically used for sub-100 nm processing technologies; however the methods and techniques described herein may be more widely applied (e.g. to >100 nm processing technologies). Low-k interconnects are porous by nature and as a result are particularly susceptible to moisture ingress. They are also more susceptible to mechanical damage (i.e. they are more prone to cracking than standard interconnects) and therefore the techniques described herein are particularly beneficial when used in combination with low-k interconnects. The examples shown in FIGS. 3a-3d also assume p-type substrates; however the principles may be equally applied to n-type substrates.

FIG. 3b shows a cross-section through a first example of an improved die seal ring in which both the bulk implantation (P-Well) and surface implantation (P+) have been blocked in the break cell (in region 301) to leave only the natural doping of the substrate (P-Substrate). The effect of blocking the implantation of dopants in this way is to increase the impedance through the substrate in the region of the break and hence to reduce the propagation of signals across a break (which may be an offset break, as described below).

In a variation of that shown in FIG. 3b which uses an n-type substrate, the bulk implantation (N-Well) and surface implantation (N+) are blocked to leave only the natural doping of the substrate (N-substrate).

In addition to blocking both the bulk and surface implantation of dopants of the same type as the substrate (e.g. p-type in the example shown in FIG. 3b), further improvements may be achieved by using one or more of the following techniques:
- introducing a well area between the two metal tracks with a dopant of the opposite type to the natural doping of the substrate;
- blocking the silicidation at the surface in the region away from the contacts or over the entire break cell (i.e. including where the contacts are); and
- introducing a doped area close to the surface which has a conduction type which is opposite to the native doping of the substrate. This may alternatively be considered as replacing a doped area close to the surface which has a conduction type which is the same as the native doping of the substrate with a doped area of the opposite conduction type.

FIG. 3c shows a cross-section through a second example of an improved die seal ring in which, in addition to blocking the bulk and surface implantation of p-type dopants in the break cell, an N-Well 302 has been introduced between the inner and outer tracks. Silicidation has been blocked in regions away from the contacts to leave regions of silicide 303 underneath the contacts 304 to the substrate 305. The blocking of silicidation either entirely or away from the contacts further increases the impedance of the electrical path across the break through the substrate. It will be appreciated that although FIG. 3c shows both the introduction of an N-Well 302 and blocking of silicidation, in other examples, these techniques may be implemented separately and/or in combination with other techniques.

FIG. 3d shows a cross-section through a third example of an improved die seal ring. In this example the bulk and surface implantation of p-type dopants has been blocked in the break cell (to leave P-Substrate in regions 306, 307) and an N-well 302 has been introduced between the metal tracks. Additionally regions 309 near the surface have been implanted with a dopant of opposite conduction type to the substrate (N+).

Figure 4A:
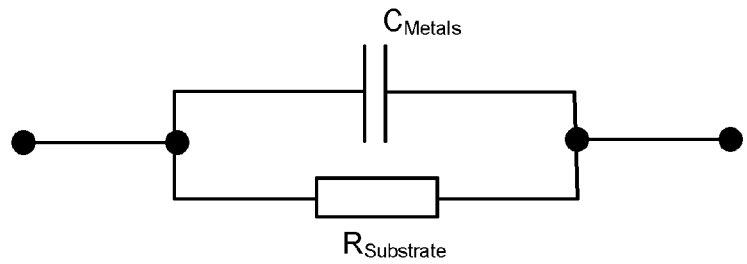
FIGS. 4a-4c show circuit diagrams which are equivalent to different break cell designs.

The electrical effect of introducing a well (e.g. N-Well 302) between the two metal tracks which has the opposite type of doping to the natural doping of the substrate can be described with reference to FIGS. 4a and 4b. FIG. 4a shows a circuit diagram which is equivalent to an offset break cell (as shown in FIG. 2) with conventional doping (as shown in FIG. 3a) or with modified doping in which both the bulk and surface implantation have been blocked in the break cell to leave only the natural doping of the substrate (as shown in FIG. 3b). As the die seal ring usually has ohmic connections to the substrate, the coupling across the break is determined by the capacitance, $C_{Metals}$, between the metal stacks (metal layers, vias and contacts) and the resistance, $R_{Substrate}$, across the substrate. For most practical geometries and signal frequencies, the impedance is dominated by the resistive path (i.e. by $R_{Substrate}$). Where the doping has been modified (as in FIG. 3b) the value of the resistor, $R_{Substrate}$, is larger than for conventional doping (as in FIG. 3a).

Figure 4B:
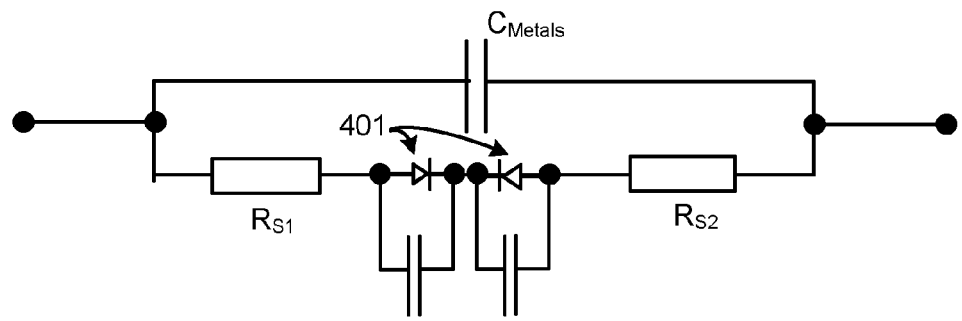

FIG. 4b shows the equivalent circuit for an offset break cell, such as shown in FIG. 2, where the silicon doping has been modified to increase the impedance of the path through the substrate by the inclusion of a well having the opposite conduction type to the substrate (e.g. the N-Well 302 shown in FIG. 3c). The well introduces a double diode 401.

Figure 4C:
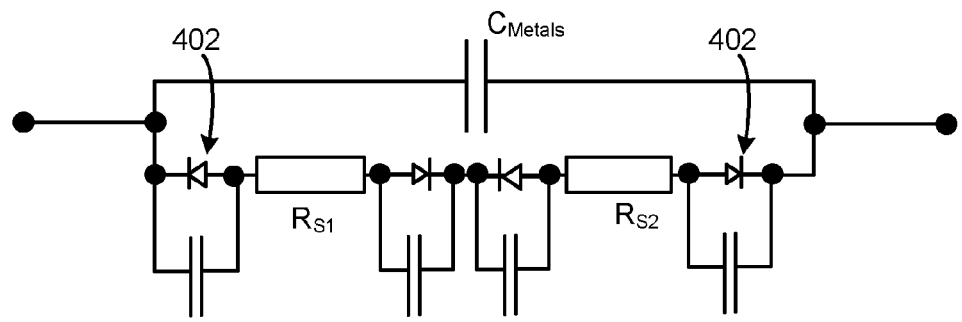

FIG. 4c shows the equivalent circuit for an offset break cell, such as shown in FIG. 2, where the bulk and surface implantation of dopants of the same type as the substrate have been blocked in the region of the break and in addition a well area has been introduced between the two metal tracks with a dopant of the opposite type to the natural doping of the substrate (e.g. N-Well 302) and a doped area has been introduced close to the surface which has a conduction type which is opposite to the native doping of the substrate (e.g. N+ regions 309), as shown in FIG. 3d. The introduction of the N+ regions (for a p-type substrate) has the electrical effect of introducing additional diodes 402 and modifying the values of the resistors $R_{S1}$ and $R_{S2}$.

The use of an improved die seal ring which includes break cells comprising offset breaks in the inner and outer tracks (as shown in FIG. 2) and variations in the implantation to increase the impedance of the substrate in the region of the break (as shown in FIGS. 3b-3d) minimizes the risk of mechanical seal ring failure (e.g. by inhibiting ingress of cracks, moisture or ions into the area occupied by the circuitry on a die) and also reduces the coupling through the seal ring. The introduction of the changes to the implantation additionally does not change the layout area requirements compared to a conventional, continuous die seal ring.

A further example of an improved die seal ring can be described with reference to FIGS. 5a-5d. FIGS. 5a-5d show an improved layout for metal layers within the die seal ring (e.g. for layer Met-1 and other metal layers not shown in FIGS. 3b-3d) and which may be used with any of the improved implantation techniques described above. The layout shown in FIGS. 5a-5d may be applied to all metal layers, local interconnect layers and the active area or any other conductive material above or below the active area within the die seal ring structure. In some examples, the layout used may be substantially identical in all the layers to which it is applied; whilst in other examples the layouts used may differ slightly between layers.

Figure 5A:
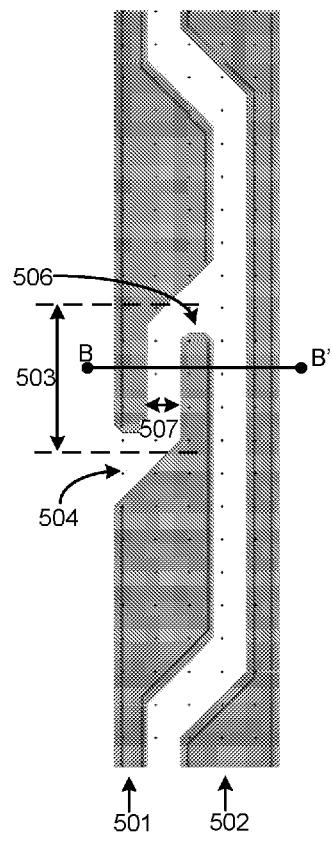
FIGS. 5a-5d show schematic diagrams of an improved break cell.

FIG. 5a shows a layer design (e.g. for a metal, interconnect, active or other conductive layer, as detailed above) for a portion of a break cell, referred to herein as a 'break segment', which includes a break in one of the two tracks (track 501). It will be appreciated that a break cell in a die seal ring comprising two tracks comprises a break in both tracks 501, 502 (e.g. as shown in FIG. 5c), which may also be referred to as a 'pair of breaks'. The design shown in FIG. 5a involves an offset 503 within an individual break 504 in a track 501, which further improves the mechanical reliability. The design uses 45° edges and bends, rather than 90° corners, to reduce the stresses in the layer. Furthermore, since 45° bends of conductor layers and continuous trenches of contact and via are typically used elsewhere in the die corners, introduction of 45° bends in the die seal ring does not introduce an additional reliability risk or design feature which might otherwise require re-qualification or additional testing. In some implementations, the ends of the tracks may be chamfered (as indicated by arrow 506) to reduce the mechanical stress in the area of the break.

The minimum width of the break segment, B-B', is limited by the minimum dimension permitted by the IC process used for 3 lines and 2 spaces. Where the same design is used in multiple layers (e.g. for all metal and active layers), the limitation may be a result of the layer which has the largest minimum dimension (e.g. the top-metal layer). The minimum width of the gap in an individual break 504 (as indicated by arrow 507 in FIG. 5a) is also limited by the minimum dimension permitted by the IC process for a single space and again this limitation may be a result of the layer which has the largest minimum dimension. If this width is increased, the coupling capacitance is decreased but the width available for diffusion of moisture or ions and for crack propagation is increased. As a result, the particular dimensions used in any situation may depend on both the processing and the packaging technology used.

Figure 5B:
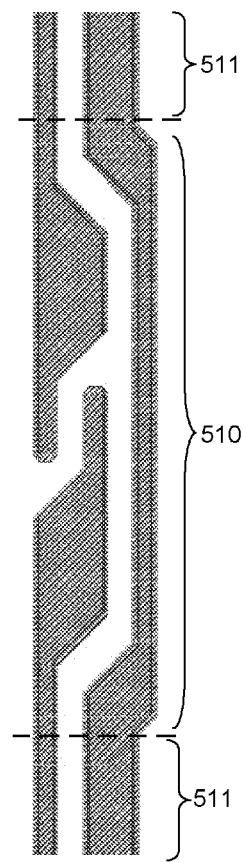
Figure 5C:
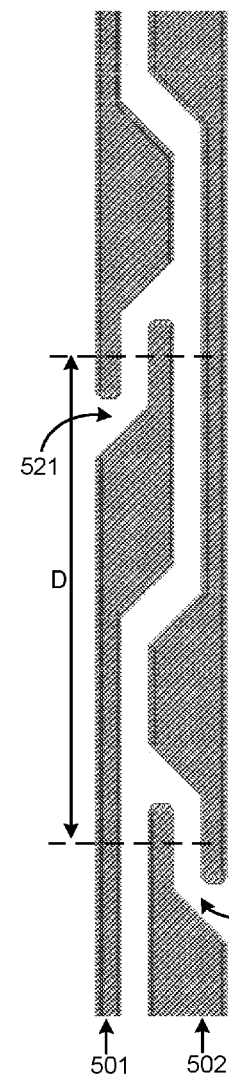

FIG. 5b shows how a break segment 510, as shown in FIG. 5a may be butted with segments of a conventional continuous seal ring 511 if required. FIG. 5c shows a complete break cell which includes a break 521, 522 in both the inner and outer tracks (or rings) 501, 502.

Figure 5D:
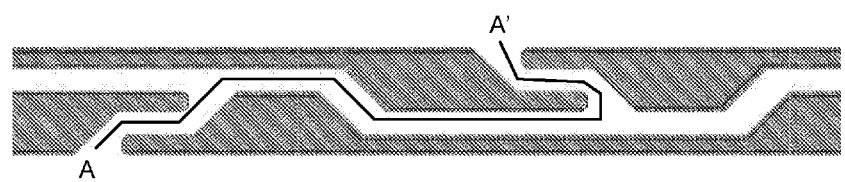

The distance, D, between the break in each rail may be adjusted to optimize the physical performance of the break: by increasing D, the diffusion path (A-A' as shown in FIG. 5d) through the dielectrics (which may be low-k dielectrics) is increased but the electrical impedance across the break cell is reduced. Furthermore, by increasing D, the reliability is improved. In many examples D may be of the order of 100s of microns in length. In an example, the length of the break cell shown in FIG. 5c may be 300 μm and the distance D may be approximately 200 μm.

As shown in FIGS. 5a-5d, by increasing the width of a track in the region around the offset break in that particular track and reducing the width of the other track in the same region, the increase in width of the break cell is minimized. As described above, in a die seal ring which comprises two tracks, the inner track is typically wider than the outer track. As a result, the outer track is widened in the region around the offset break in the outer track and the inner track is narrowed (e.g. to approximately the same width as the outer track in the conventional die seal ring) in the region around the offset break in the outer track. In the region around the offset break in the inner track, the width of the inner track may remain the same as in a conventional die seal ring or may be increased in width slightly to accommodate the offset break (and this may be dependent upon the design rules for the particular process used), and the width of the outer track may remain the same as in a conventional die seal ring (e.g. at a width which is set by the minimum allowed width in any of the metal layers used in the particular process).

In the example shown in FIGS. 5a-5d, the break segment is only very slightly wider than the conventional continuous seal ring (e.g. 10 μm wide, compared to 8 μm wide) which results in the break segment encroaching a small distance (e.g. 2 μm) into the keep-out zone. However, as a result of the reduced coupling of noise due to the improved design and implantation change (as shown in FIGS. 3b-3d), the overall width of the keep-out zone does not need to be increased and there is no impact on the layout area requirements compared to a conventional, continuous die seal ring. As a result the gross yield of die per wafer is unaffected and is larger than for alternative solutions where the keep-out zone is increased.

Figure 6A:
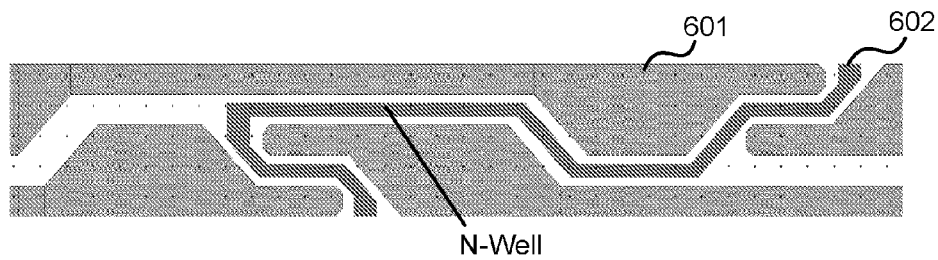
FIGS. 6a-6d show layouts for various layers in an improved break cell, such as that shown in FIGS. 5a-5d.
Figure 6B:
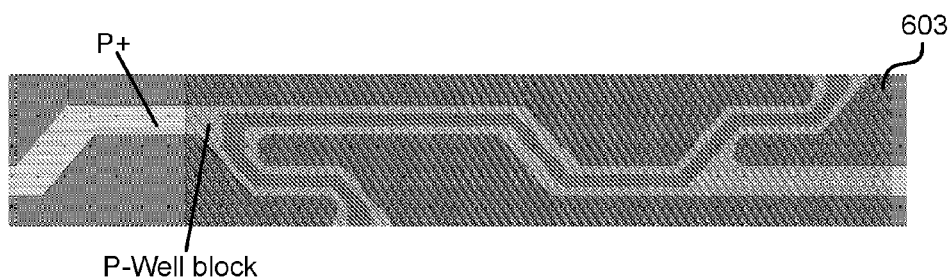
Figure 6C:
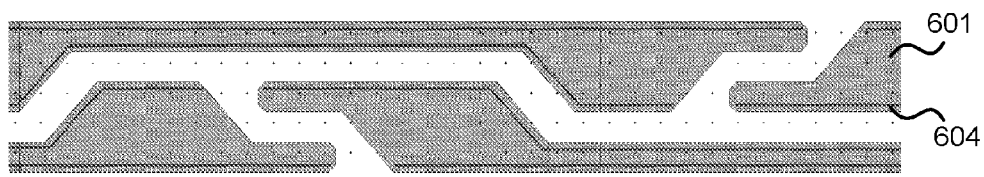
Figure 6D:
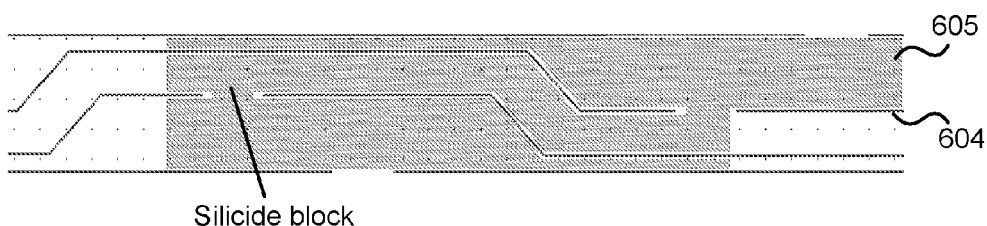

As described, the improved layer design shown in FIGS. 5a-5c may be used with any of the improved doping techniques (i.e. improved doping distributions) described above, examples of which are shown in FIGS. 3b-3d. FIGS. 6a-6d show layout views of various layers, including dopant layers, for an example of an improved break cell. This example shows a combination of the design of FIG. 5c and the change in distribution of dopants shown in FIG. 3c. FIG. 6a shows a metal/active layer 601 (or any other of the layers in which the revised layout is implemented, as detailed above) and the position of the N-Well 602 and FIG. 6b shows the additional layer 603 (referred to herein as 'P-Well block') which is used to block both the surface (P+) and bulk (P-Well) implantation in the region of the break cell. FIG. 6c shows the metal and trench contact layers 601, 604 (but not individual contacts and vias) and FIG. 6d shows the trench contact and silicide-block layers 604, 605.

The use of an improved die seal ring, such as shown in FIGS. 5a-5c and 6a-6d, which includes break cells comprising offset breaks in the inner and outer tracks and variations in the implantation to increase the impedance of the substrate in the region of the break minimizes the risk of mechanical seal ring failure, reduces the coupling through the seal ring and does not change the layout area requirements compared to a conventional, continuous die seal ring.

Figure 7A:
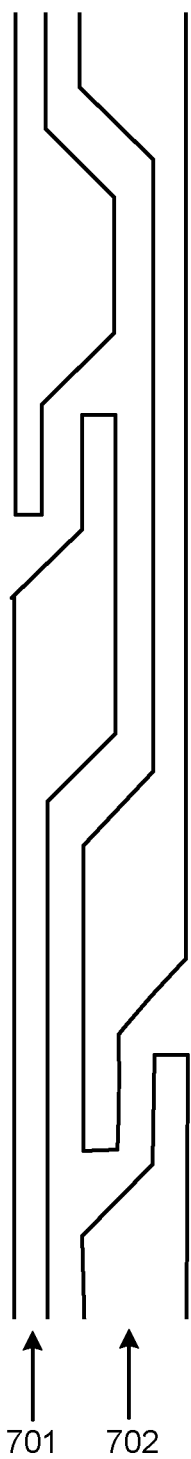
FIGS. 7a-7b and 8a-8d show further examples of an improved break cell.
Figure 7B:
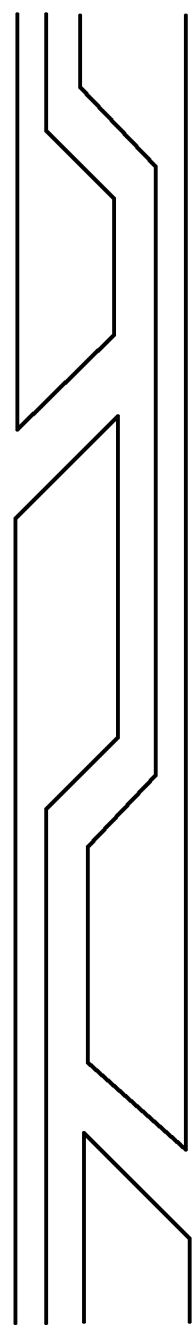

It will be appreciated that FIGS. 5a-5c show one example layout of a break cell which includes offsets in each individual break and other layouts may alternatively be used in combination with the changes in implantation described above. Two further examples are shown in FIGS. 7a-7b. FIG. 7a shows a layer design in which the breaks in the two tracks 701, 702 are parallel, rather than being arranged at 90° to each other (as in FIG. 5c). FIG. 7b shows a layer design in which the break within a track is not 'S-shaped' (as in FIGS. 5a-5d and 7a) but instead a diagonal break is used. Although this is not shown in FIG. 7b, the corners may be chamfered in order that design rules are not violated (e.g. through use of acute angles).

Although FIGS. 2, 5c, 5d, 7a and 7b show the use of offset breaks (between the inner and outer tracks) in combination with the modification to implantation in order to increase the impedance of the electrical path through the substrate (e.g. as shown in the examples of FIGS. 3b-3d), the modified implantation techniques may alternatively be used in situations where the breaks in the outer and inner tracks are not offset.

Figure 8A:
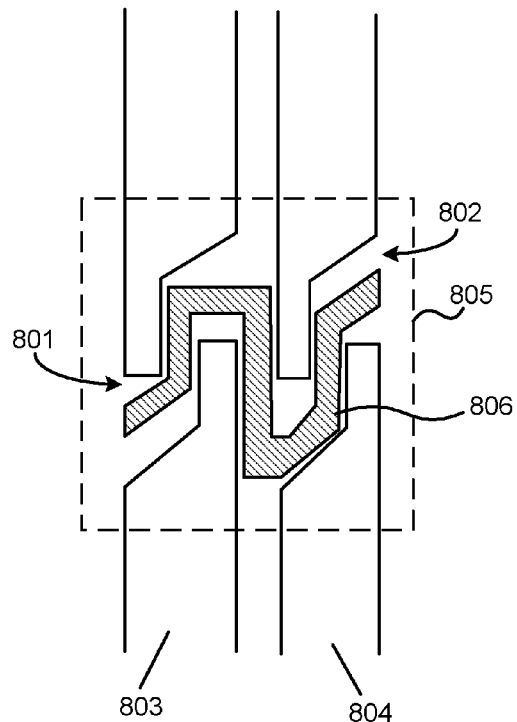

FIG. 8a shows an example of an improved break cell, where offsets are used within each individual break 801, 802 in the inner and outer track 803, 804, but the two breaks are not offset from each other. In this example, the modified implantation is shown by way of a dotted region 805 indicating the region in which both bulk and surface implantation of a dopant of the same conduction type as the substrate is blocked (e.g. a P+ and P-Well block for a p-type substrate). The position of a well area 806 with a dopant of the opposite type to the substrate (e.g. an N-Well) is also indicated, although as described above, some examples may not include such a well area (e.g. when using the modified implantation example shown in FIG. 3b). FIG. 8b shows a further example of an improved break cell where there is no offsetting, either between breaks or within an individual break. Again, the position of the p-type implantation block 805 and any N-Well area 806 (for a p-type substrate, or P-Well area for an n-type substrate) is shown.

Figure 8C:
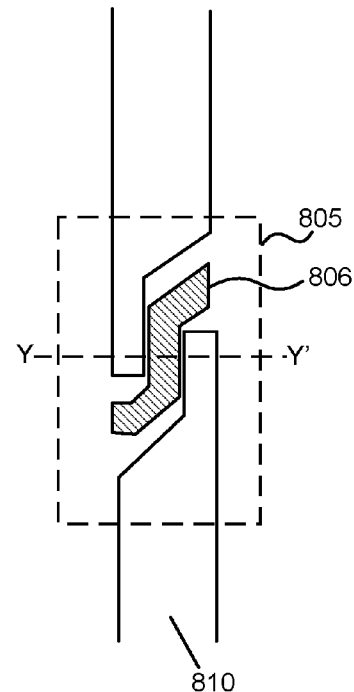
Figure 8B:
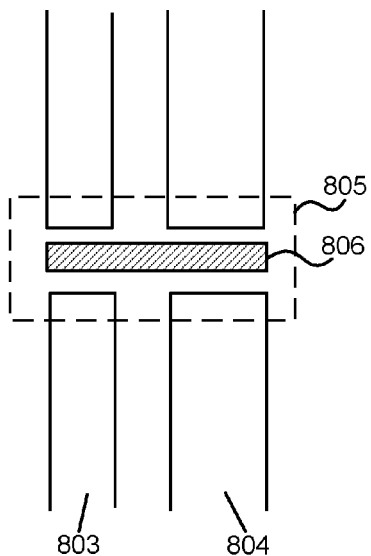
Figure 8D:
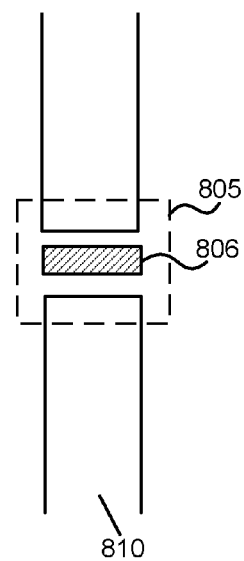

FIGS. 8c and 8d show improved break cells in a die seal ring which only comprises a single ring (or track) 810. As in FIGS. 8a and 8b, the position of the implantation block 805 and any well area 806 is shown. Dependent upon which of the implantation modification techniques described above are used, a cross-section Y-Y' through the die seal ring shown in FIG. 8c may be as shown in any of FIGS. 3b-3d.

The improved break cells described herein may be inserted into a conventional die seal ring to increase its electrical impedance and reduce coupling whilst maintaining its function as a mechanical protection structure.

The above description details various different designs for an improved break in a die seal ring which involves modification of the implantation in the region of the break and may also involve a change in the design of the metal and active layers compared to a conventional break in a die seal ring. An IC design may involve more than one break cell (e.g. more than one pair of breaks, where a double die seal ring is used). In order to improve further the performance of the die, the breaks may be positioned with respect to the placement of the chip components and the structure of the power, ESD and ground rails. For example, the breaks may be placed to coincide with boundaries between supply domains in the IC, where there is a break in the power and ESD rails, where there is a functional break in the cells on the die and/or around particularly sensitive elements or components. In an example, a die may comprise a number of breaks (e.g. seven breaks) which are located either side of particular components, such as inductors, either side of audio circuitry and at the interfaces between digital and analogue sections on the die. In some situations, additional breaks may be included to ensure symmetry around particular components or circuit elements. In another enhancement, sections of the die seal ring may be grounded to a suitable ground where the die seal ring passes a ground pad. This provides improved grounding compared to the conventional technique of grounding the die seal ring through the substrate. In some examples, a ground pad may be included in the IC design in order to ground a section of the die seal ring and hence to direct any coupled signals to ground. In some examples, the die seal ring may be used as part of an ESD return path and therefore provide additional ESD protection.

In some examples, breaks may be placed all around the die, such that the die seal ring is formed from a continuous chain of break cells. However, the suitability of such an implementation may depend on the type of dielectrics used or other factors of the design or process technology. With some dielectrics (e.g. low-k dielectrics) it may be optimum to use a small number of break cells (e.g. the minimum number which provides the required electrical performance) in order to achieve the best combination of performance, reliability and manufacturing yield.

In order to optimize the performance of the die, the position of the breaks in the die seal ring may be considered in combination with the overall layout of the die, rather than being considered a separate, independent structure (e.g. which may be added to an already complete design. The inclusion of the placement of break cells as part of the IC design process enables parasitic signal management. In some examples, the die seal ring (and its breaks) may be modeled in combination with the die circuitry itself in order that any effects from coupling to the die seal ring can be considered and minimized (e.g. through appropriate placement of breaks).

The designs of those break cells described herein which involve offsets (either within a single break or between the breaks in different tracks within the die seal ring) provide no direct path in any metal, via, contact or active layer from the outside of the die seal ring to the inside of the die seal ring. Any trajectory to the inner section of the IC from outside the die seal ring hits metal and does not pass through oxide alone.

Although the designs and improved break cells described above relate to die seal rings which include one or two tracks, the techniques described herein may also be applied to die seal rings containing more than two tracks.

The improved layer designs detailed above are described in combination with a change in doping and/or silicidation in order to increase the impedance of the electrical path through the substrate; however, the improved layer designs shown in FIGS. 5a-5d, 6c, 7a-7b, 8a and 8c may alternatively be used independent of the described changes in implantation.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term 'comprising' is used herein to mean including the method blocks or elements identified, but that such blocks or elements do not comprise and exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. An integrated circuit die comprising:
   electronic circuitry formed on a substrate; and
   a seal ring around a periphery of the die, the seal ring comprising at least one break; and
   a block doped region around the break, said block doped region being of the same conduction type as the substrate and modified by introduction of a well and a surface doped area both of which are of an opposite conduction type to the substrate in the break so as to increase the electrical impedance of a path through the substrate across the break.

2. An integrated circuit die according to claim 1, wherein silicidation in said block doped region is blocked in at least a portion away from a metal contact to the substrate.

3. An integrated circuit die according to claim 1, wherein the seal ring comprises at least one track and wherein the break comprises an offset break within a track.

4. An integrated circuit die according to claim 3, wherein the offset break is formed using 45° bends.

5. An integrated circuit die according to claim 1, wherein the seal ring comprises at least two tracks and wherein the break comprises an offset break between tracks.

6. An integrated circuit die according to claim 1, wherein the seal ring comprises a first and a second track and wherein the at least one break comprises an offset break within each track and wherein the offset break in the first track is offset from the offset break in the second track.

7. An integrated circuit die according to claim 6, wherein a width of the second track is increased in a region around the offset break within the second track and a width of the first track is decreased within the region around the offset break within the second track.

8. An integrated circuit die according to claim 1, wherein the offset break is formed in each metal layer and each continuous conductive layer in the seal ring.

9. An integrated circuit die according to claim 1, wherein the doping in the seal ring in the block doped region around the break is modified to increase electrical impedance of a path laterally through the substrate across the break.

10. An integrated circuit die according to claim 1, wherein doping in the seal ring, away from the break, is unmodified.

11. An integrated circuit die comprising:
   electronic circuitry formed on a substrate; and
   a seal ring around a periphery of the die, the seal ring comprising a first and a second track and at least one break pair;
   wherein said break pair comprises an offset break within each track; wherein the offset break in the first track is offset from the offset break in the second track; and wherein a width of the second track is increased in a region around the offset break within the second track and a width of the first track is decreased within the region around the offset break within the second track.

12. An integrated circuit die according to claim 11, further comprising a region around the break pair in which the doping is modified to increase electrical impedance of a path through the substrate across the break.

* * * * *